US009965194B2

(12) United States Patent
Lin et al.

(10) Patent No.: US 9,965,194 B2
(45) Date of Patent: May 8, 2018

(54) DATA WRITING METHOD, MEMORY CONTROL CIRCUIT UNIT AND MEMORY STORAGE APPARATUS WHICH PERFORMS DATA ARRANGEMENT OPERATION ACCORDING TO USAGE FREQUENCY OF PHYSICAL ERASING UNIT OF MEMORY STORAGE APPARATUS

(71) Applicant: PHISON ELECTRONICS CORP., Miaoli (TW)

(72) Inventors: Chin-Min Lin, Hsinchu (TW); Yueh-Hsuan Tsai, Hsinchu County (TW); Tzu-Yin Lin, Tainan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days. days.

(21) Appl. No.: 15/333,197

(22) Filed: Oct. 25, 2016

(65) Prior Publication Data
US 2018/0067648 A1   Mar. 8, 2018

(30) Foreign Application Priority Data

Sep. 7, 2016   (TW) .............................. 105128989 A

(51) Int. Cl.
*G11C 16/34*   (2006.01)
*G06F 3/06*   (2006.01)

(52) U.S. Cl.
CPC ............ *G06F 3/061* (2013.01); *G06F 3/0652* (2013.01); *G06F 3/0659* (2013.01); *G06F 3/0679* (2013.01); *G11C 16/349* (2013.01)

(58) Field of Classification Search
CPC .............. G11C 16/349; G11C 16/3495; G11C 13/0035; G11C 16/16; G11C 16/107; G06F 3/061; G06F 3/0652; G06F 3/0659; G06F 3/0679
See application file for complete search history.

(56) References Cited

U.S. PATENT DOCUMENTS

| 8,275,931 | B2 * | 9/2012 | Yeh | G06F 12/0246 365/185.29 |
| 9,086,954 | B2 * | 7/2015 | Yeh | G06F 12/0246 |
| 2010/0023675 | A1 * | 1/2010 | Chen | G06F 12/0246 711/103 |
| 2010/0077266 | A1 * | 3/2010 | Kanno | G06F 11/1068 714/704 |
| 2013/0007353 | A1 * | 1/2013 | Shim | G11C 16/10 711/103 |
| 2014/0129206 | A1 * | 5/2014 | Cheng | G06F 17/5022 703/24 |
| 2014/0269068 | A1 * | 9/2014 | D'Abreu | G11C 16/16 365/185.11 |

* cited by examiner

*Primary Examiner* — Khamdan Alrobaie
(74) *Attorney, Agent, or Firm* — JCIPRNET

(57) ABSTRACT

A data writing method, a memory control circuit unit and a memory storage apparatus are provided. The method includes: receiving a first write command and first data corresponding to the first write command, and writing the first data into a third physical erasing unit in first physical erasing units; and if a usage frequency of a fourth physical erasing unit in the first physical erasing units is less than a predetermined value, performing a data arrangement operation corresponding to the first write command to copy second data stored by the fourth physical to at least one of second physical erasing units.

27 Claims, 8 Drawing Sheets

DATA WRITING METHOD, MEMORY CONTROL CIRCUIT UNIT AND MEMORY STORAGE APPARATUS WHICH PERFORMS DATA ARRANGEMENT OPERATION ACCORDING TO USAGE FREQUENCY OF PHYSICAL ERASING UNIT OF MEMORY STORAGE APPARATUS

CROSS-REFERENCE TO RELATED APPLICATION

This application claims the priority benefit of Taiwan application serial no. 105128989, filed on Sep. 7, 2016. The entirety of the above-mentioned patent application is hereby incorporated by reference herein and made a part of this specification.

BACKGROUND

Technical Field

The present invention relates to a data writing method, and more particularly, to a data writing method of a rewritable non-volatile memory module, and a memory control circuit unit and a memory storage apparatus using the same.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a memory storage apparatus which utilizes a flash memory module as a storage medium. For these reasons, the flash memory has become an import part of the electronic industries.

Generally, when the memory storage apparatus serves as various non-volatile memory storage apparatus like SD card, CF card or an embedded storage device used by systems including a digital camera, a camcorder, a communication device or a tablet computer, if the data writing speed of the memory storage apparatus is overly slow for storing videos or images when taking photos or recording videos, data temporarily stored in a cache memory may be erased before being written into the rewritable non-volatile memory module. In this case, the videos or the images to be stored may be incomplete due to a data loss.

Therefore, it is one of the major subjects in the field as how to improve speed and performance of the memory storage apparatus in a data writing operation in order to prevent the data from being erased before written into the rewritable non-volatile memory module, so as to ensure a reliability of the data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data writing method, a memory control circuit unit and a memory storage apparatus, which are capable of improving speed and performance of the memory storage apparatus during the data writing operation.

An exemplary embodiment of the invention provides a data writing method for a rewritable non-volatile memory module. The rewritable non-volatile memory module includes a plurality of physical erasing units. The physical erasing units at least include a plurality of first physical erasing units and a plurality of second physical erasing units. The data writing method includes: receiving a first write command and first data corresponding to the first write command, and writing the first data into one or more third physical erasing units in the first physical erasing units; and if a usage frequency of one or more fourth physical erasing units in the first physical erasing units is less than a predetermined value, performing a data arrangement operation corresponding to the first write command to copy second data stored by the one or more fourth physical erasing units to at least one of second physical erasing units.

Another exemplary embodiment of the invention provides a memory control circuit unit, which is configured to control a rewritable non-volatile memory module. The rewritable non-volatile memory module includes a plurality of physical erasing units. The physical erasing units at least include a plurality of first physical erasing units and a plurality of second physical erasing units. The memory control circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is configured to receive a first write command and first data corresponding to the first write command and write the first data into one or more physical erasing units in the first physical erasing units. If a usage frequency of one or more fourth physical erasing units in the first physical erasing units is less than a predetermined value, the memory management circuit performs a data arrangement operation corresponding to the first write command to copy at least one second data stored by the one or more fourth physical erasing units to at least one of the second physical erasing units.

Another exemplary embodiment of the invention provides a memory storage apparatus, which includes a connection interface unit, a rewritable non-volatile memory module and a memory control circuit unit. The connection interface unit is configured to couple to a host system. The rewritable non-volatile memory module includes a plurality of physical erasing units. The physical erasing units at least include a plurality of first physical erasing units and a plurality of second physical erasing units. The memory control circuit unit is coupled to the connection interface unit and the rewritable non-volatile memory module. The memory control circuit unit is configured to receive a first write command and first data corresponding to the first write command and write the first data into one or more third physical erasing units in the first physical erasing units. If a usage frequency of one or more fourth physical erasing units in the first physical erasing units is less than a predetermined value, the memory control circuit unit performs a data arrangement operation corresponding to the first write command to copy second data stored by the one or more fourth physical erasing units to at least one of the second physical erasing units.

Based on the above, according to the exemplary embodiments of the invention, by identifying the count value counted for each of the physical erasing units, the time in which each physical erasing unit temporarily stored with data is in an idle state may be obtained to actively arrange the physical erasing units temporarily stored with an unchanged data over long time. Accordingly, an overly-long waiting time and the data loss caused by insufficient number of physical erasing units for temporarily storing data may be prevented. On the other hand, according to the mechanism of the present exemplary embodiment in which the obtained command information of the command information queue are executed in the pipeline manner, because the data arrangement operation corresponding to one write command and the data merging operation corresponding to another write command may be simultaneously performed, a writing time for writing the data corresponding to one write command may be substantially reduced. As a result, speed and performance of the memory storage apparatus may be improved.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
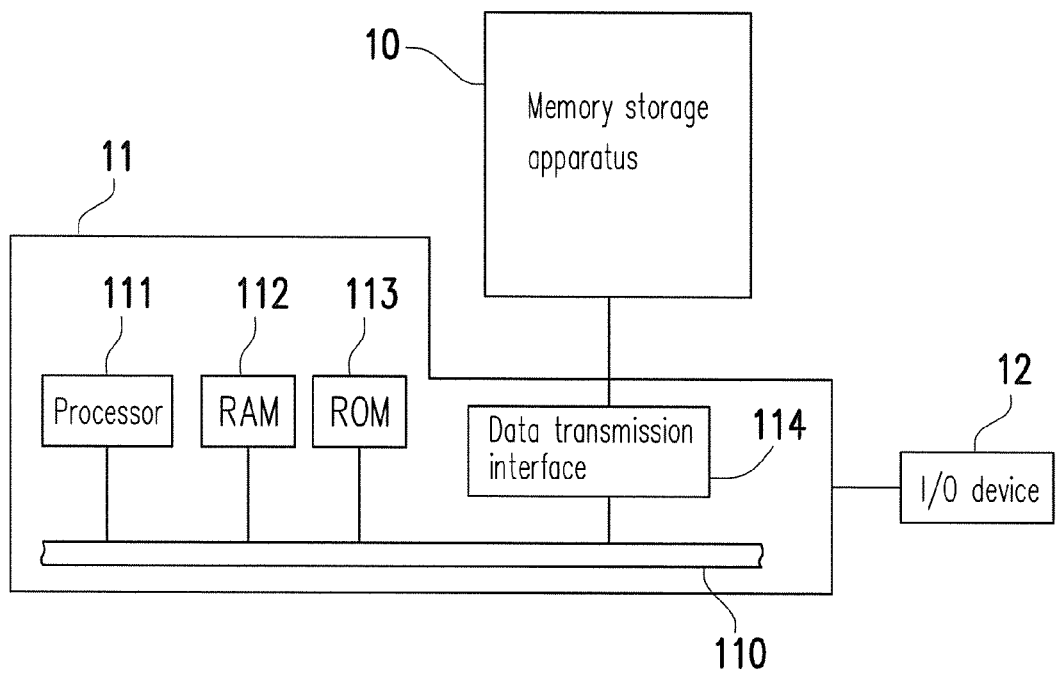
FIG. 1 is a schematic diagram illustrating a host system, a memory storage apparatus and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit). The memory storage apparatus is usually configured together with a host system so the host system can write data into or read data from the memory storage apparatus.

Figure 2:
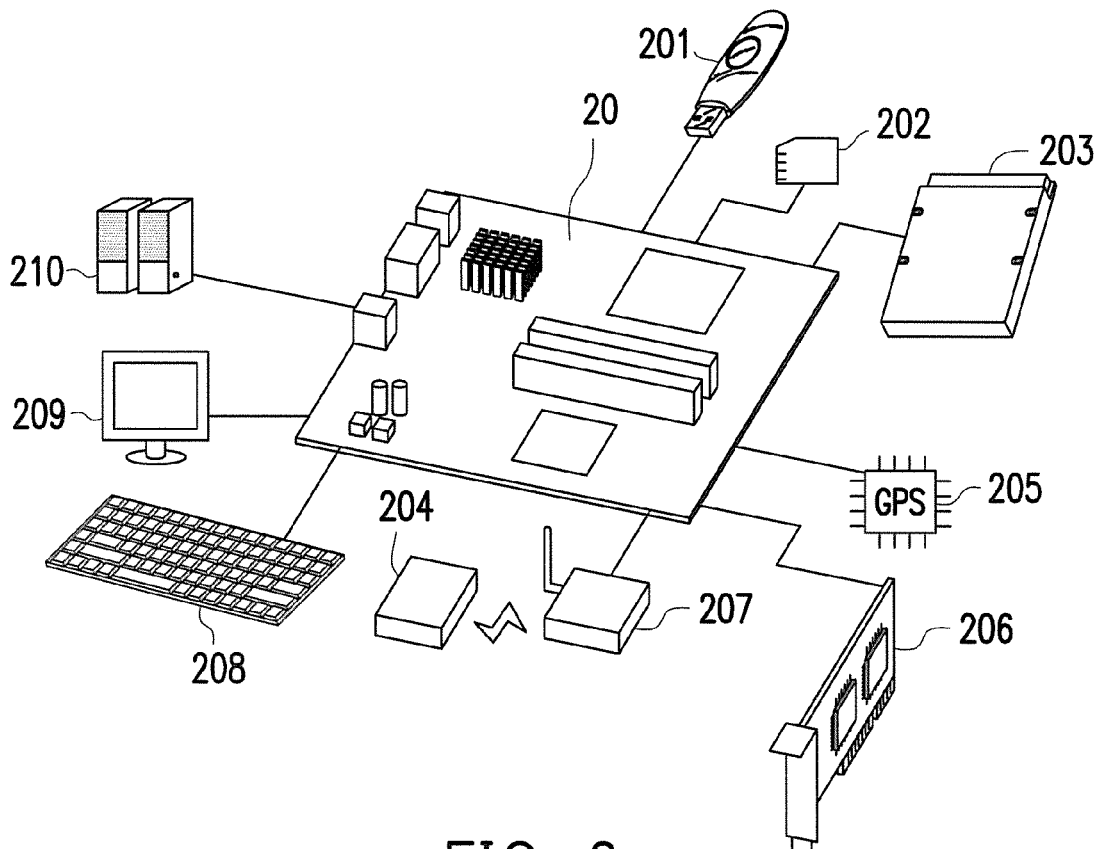
FIG. 2 is a schematic diagram illustrating a host system, a memory storage apparatus and an I/O device according to another exemplary embodiment of the invention.

FIG. 1 is a schematic diagram illustrating a host system, a memory storage apparatus and an I/O (input/output) device according to an exemplary embodiment of the invention. FIG. 2 is a schematic diagram illustrating a host system, a memory storage apparatus and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 can write data into the memory storage apparatus 10 or read data from the memory storage apparatus 10 through the data transmission interface 114. Further, the host system 11 is coupled to an I/O device 12 through the system bus 110. For example, the host system 11 can transmit output signals to the I/O device 12 or receive input signals from the I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 through the wireless transmission device 207.

Figure 3:
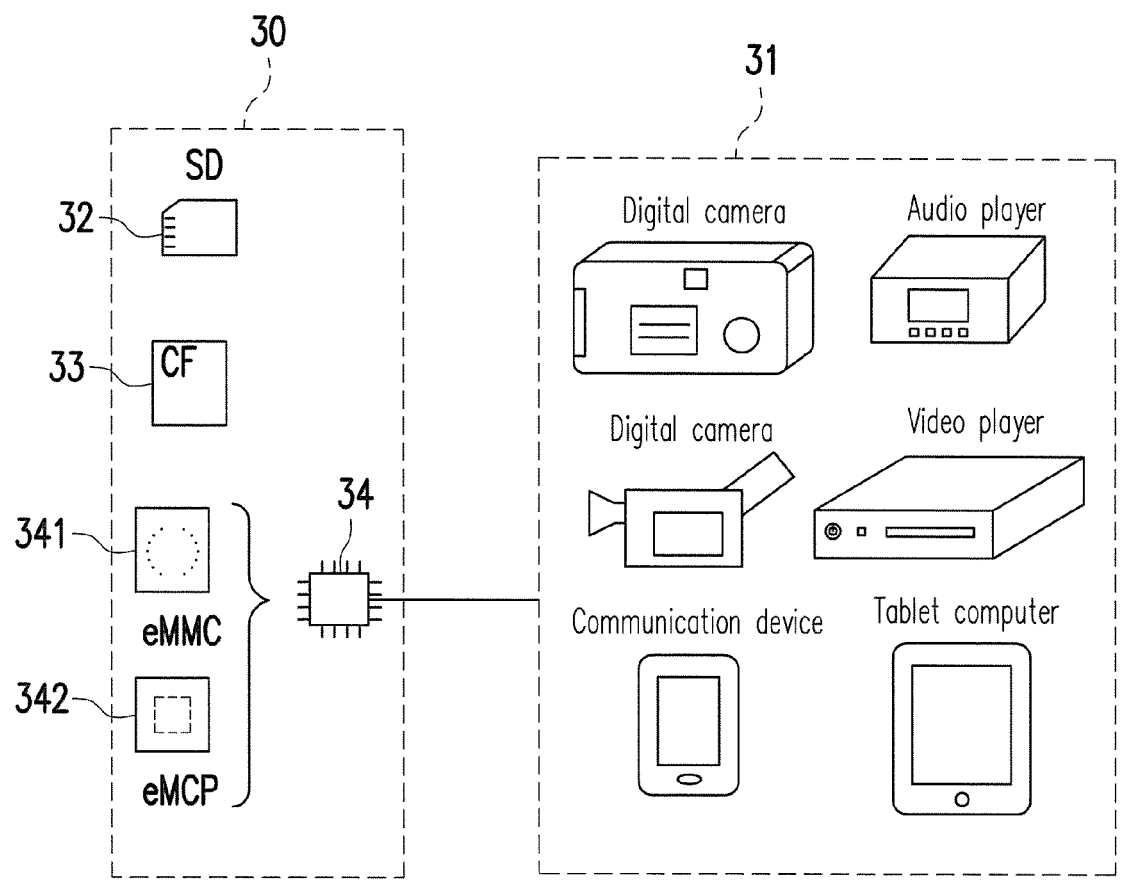
FIG. 3 is a schematic diagram illustrating a host system and a memory storage apparatus according to another exemplary embodiment of the invention.

In an exemplary embodiment, aforementioned host system may be any system capable of substantially cooperating with the memory storage apparatus for storing data. Although the host system is illustrated as a computer system in foregoing exemplary embodiment, nonetheless, FIG. 3 is a schematic diagram illustrating a host system and a memory storage apparatus according to another exemplary embodiment of the invention. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
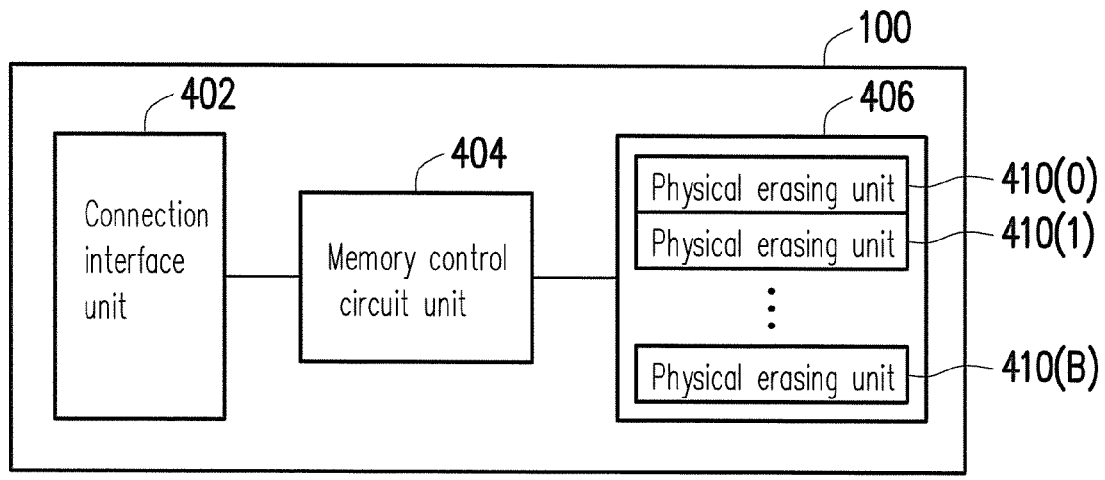
FIG. 4 is a schematic block diagram illustrating a memory storage apparatus according to an exemplary embodiment of the invention.

FIG. 4 is a schematic block diagram illustrating a memory storage apparatus according to an exemplary embodiment of the invention.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The rewritable non-volatile memory module 406 is coupled to the memory control circuit unit 404 and configured to store data written from the host system 11. The rewritable non-volatile memory storage module 406 includes multiple physical erasing units 410(0) to 410(B). For example, the physical erasing units 410(0) to 410(B) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited thereto. Each physical erasing unit may be constituted by 64 physical programming units, 256 physical programming units or any amount of the physical programming units.

Figure 5:
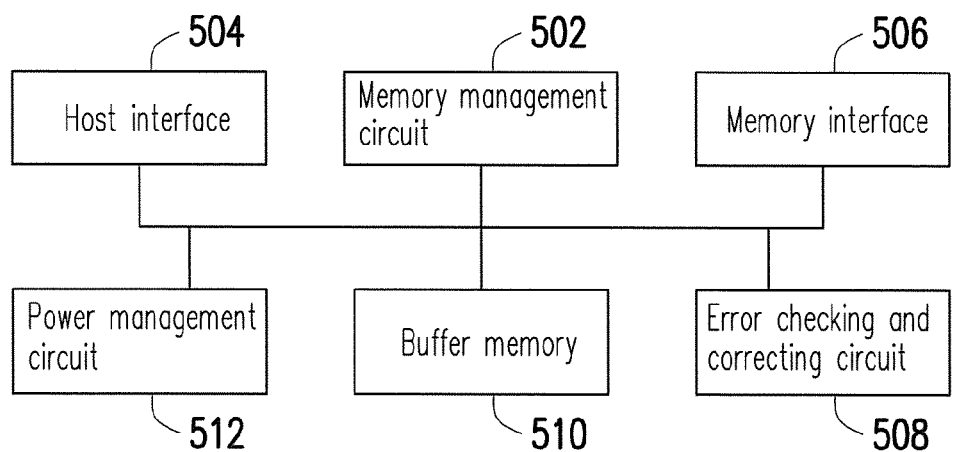
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands and the control commands are executed to perform various operations such as writing, reading and erasing data during operation of the memory storage apparatus 10. Hereinafter, operations of the memory management circuit 502 are described as equivalent to describe operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage apparatus 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 through the host interface 504. In the present exemplary embodiment, the host interface 504 is compatible with the SATA standard. However, it is to be understood that the invention is not limited thereto. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and configured to perform an error checking and correcting operation to ensure integrity of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage apparatus 10.

It is noted that in the following description, some terms may be replaced with corresponding abbreviations for ease of reading (see Table 1).

TABLE 1

| logical-to-physical mapping table | L2P table |
| physical-to-logical mapping table | P2L table |
| rewritable non-volatile memory module | RNVM module |
| physical unit | PU |
| physical erasing unit | PEU |
| physical programming unit | PPU |
| logical unit | LU |
| logical erasing unit | LEU |
| logical programming unit | LPU |
| memory management circuit | MMC |
| memory control circuit unit | MCCU |
| error checking and correcting circuit | ECCC |

In the present exemplary embodiment, the memory cells of the RNVM module 406 constitute a plurality of PPUs, and the PPUs constitute a plurality of PEUs. For example, the memory cells on the same word line constitute one or more PPUs. If each of the memory cells can store more than one bit, the PPUs on the same word line can be at least classified into a lower PPU and an upper PPU. For instance, a least significant bit (LSB) of one memory cell belongs to the lower PPU, and a most significant bit (MSB) of one memory cell belongs to the upper PPU. Generally, in the MLC NAND flash memory, a writing speed of the lower PPU is higher than a writing speed of the upper PPU, and/or a reliability of the lower PPU is higher than a reliability of the upper PPU.

In the present exemplary embodiment, the PPU is the minimum unit for programming. That is, the PPU is the minimum unit for writing data. For example, the PPU is a physical page or a physical sector. When the PPUs are the physical page, these PPUs usually include a data bit area and a redundancy bit area. The data bit area includes multiple physical sectors configured to store user data, and the redundant bit area is configured to store system data (e.g., an error correcting code).

In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the PEU is the minimum unit for erasing. Namely, each PEU contains the least number of memory cells to be erased together. For instance, the PEU is a physical block.

Figure 6:
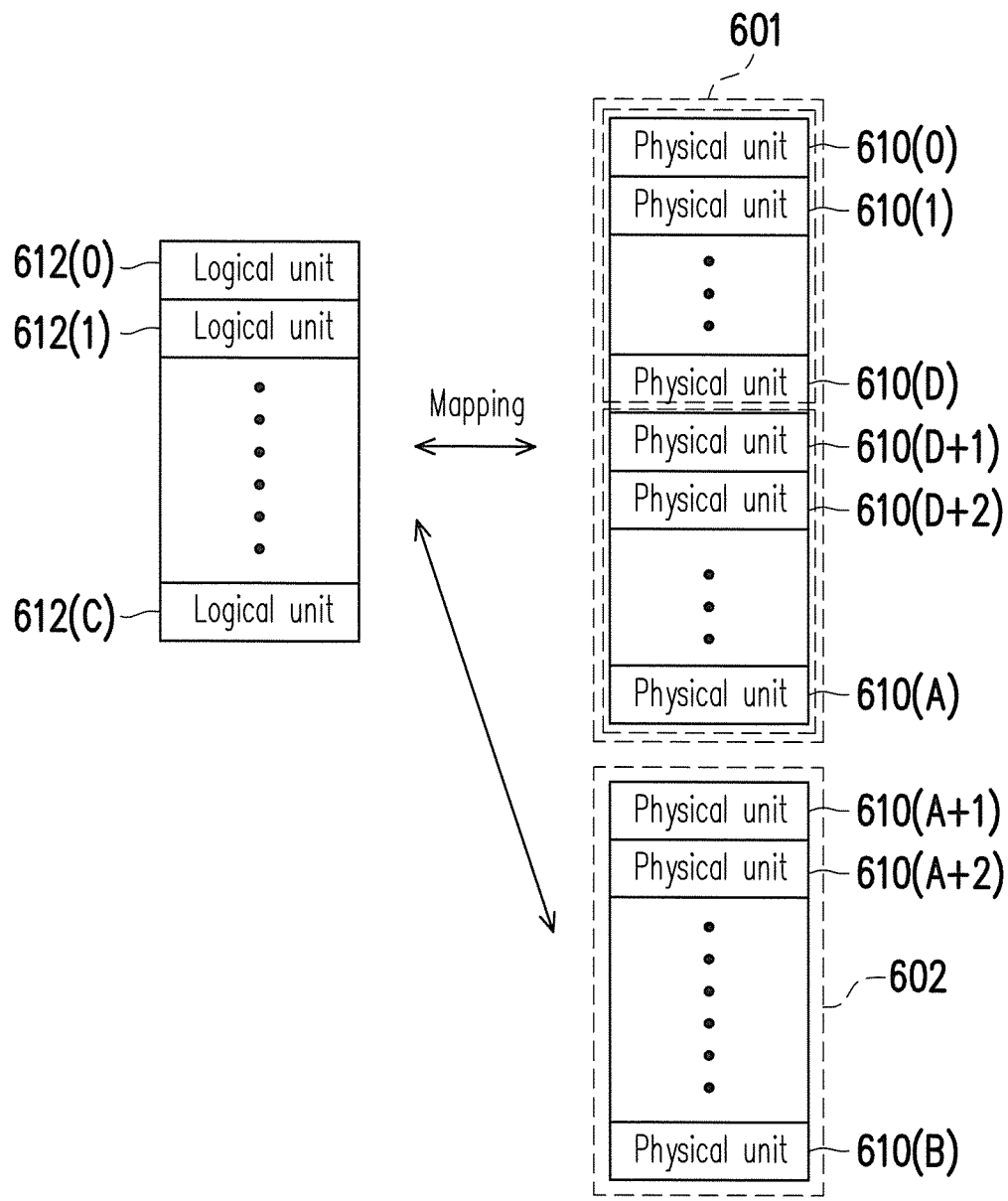
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. It should be understood that terms, such as "select" and "group", are logical concepts which describe operations in the PUs of the RNVM module 406. That is to say, the physical units of the RNVM module 406 are logically operated while actual locations of the physical units of the RNVM module 406 remain unchanged.

Referring to FIG. 6, in the present exemplary embodiment, the MMC 502 logically groups PEUs 610(0) to 610(B) of the RNVM module 406 into a storage area and a spare area. The PUs in the storage area are stored with data, and the PUs in the spare area are not yet used for storing data. For example, each PU belonging to the storage area may be stored with valid data and/or invalid data, and one PU belonging to the storage area being erased is associated to the spare area. After one PU belonging to the storage area is fully written, one specific PU is then selected from the spare area and associated to the storage area for storing other data.

Further, in the present exemplary embodiment, the MMC 502 also logically groups the PEUs 610(0) to 610(B) of the RNVM module 406 into a SLC area 601 and a TLC area 602, and assigns LUs 612(0) to 612(C) for mapping to part of the PEUs among the PEUs 610(0) to 610(A) of the SLC area 601 and part of the PEUs among the PEUs 610(A+1) to 610(B) of the TLC area 602. For example, in the present exemplary embodiment, the host system 11 accesses the data stored in the SLC area 601 and the TLC area 602 through a logical address (LA). Therefore, each LU in the LUs 612(0) to 612(C) refers to one logical address. In addition, each LU in the LUs 612(0) to 612(C) may also refer to one LPU, one LEU or a composition of a plurality of continuous or discontinuous logical addresses. Also, each LU in the LUs 612(0) to 612(C) may also be mapped to one or more PEUs. It should be noted that, the exemplary embodiments of the invention are described with the example in which the MMC 502 logically groups the PEUs 610(0) to 610(B) of the RNVM module 406 into the SLC area 601 and the TLC area 602. However, the invention is not limited thereto. For example, in another exemplary embodiment, the MMC 502 may also logically group the PEUs 610(0) to 610(B) of the RNVM module 406 into a SLC area and a MLC area.

The MMC 502 records a mapping relation (also known as a logical-physical mapping relation) between the LUs and the PEUs into at least one logical-physical mapping table. When the host system 11 intends to read the data from the memory storage apparatus 10 or write the data into the memory storage apparatus 10, the MMC 502 may access the data in the memory storage apparatus 10 according to the L2P table.

Particularly, in the present exemplary embodiment, the MMC 502 also configures the PEUs 610(0) to 610(A) belonging to the SLC area 601 (including first PEUs 610(0) to 610(D) or second PEUs 610(D+1) to 610(B)) to be programmed based on a programming mode (hereinafter, also known as a first programming mode), and initially configures the PEUs 610(A+1) to 610(B) (hereinafter, also known as fifth PEUs) belonging to the TLC area 602 to be programmed based on another programming mode (hereinafter, also known as a second programming mode). Generally, a programming speed for programming the memory cells based on the first programming mode is higher than a programming speed for programming the memory cells based on the second programming mode. Moreover, a reliability of the data stored based on the first programming mode is often higher than a reliability of the data stored based on the second programming mode.

In the present exemplary embodiment, the first programming mode refers to one of a single layer memory cell (SLC) mode, a lower physical programming mode, a mixture programming mode and a less layer memory cell mode. In the single layer memory cell mode, one memory cell is only stored with data of one bit. In the lower physical programming mode, only the lower PPUs are programmed, and the upper PPUs corresponding to the lower PPUs do not have be programmed. In the mixture programming mode, valid data (or real data) are programmed into the lower PPUs, and dummy data is programmed into the upper PPUs corresponding to the lower PPUs sorted with the valid data. In the less layer memory cell mode, one memory cell stores data with a first number of bits. For example, the first number may be set to "1".

In the present exemplary embodiment, the second programming mode refers to a Multi level cell (MLC) programming mode, a Trinary level cell (TLC) programming mode or other similar modes. In the second programming mode, one memory cell is stored with data of a second number of bits, and the second number is equal to or greater than "2". For example, the second number may be set to 2 or 3. In another exemplary embodiment, the first number in the first programming mode and the second number in the second programming mode may be other numbers as long as the second number is greater than the first number.

Generally, when the memory storage apparatus 10 serves as various non-volatile memory storage apparatus like SD card, CF card or an embedded storage device used by systems including a digital camera, a camcorder, a communication device, an audio player, a video layer or a tablet computer, the PEUs 610(0) to 610(A) of the SLC area 601 are divided to at least include a plurality of first PEUs 610(0) to 610(D) and a plurality of second PEUs 610(D+1) to 610(A). The first PEUs 610(0) to 610(D) are configured to temporarily store data having discontinuous logical addresses, such as data having different paths or small data (e.g., data that is regularly and repeatedly updated or data smaller than one PPU), from the host system 11. The second PEUs 610(D+1) 610(A) are configured to temporarily store arranged data having continuous logical addresses in the first PEUs. For example, the MMC 502 groups each three of the first PEUs into one group and groups each three of the second PEUs into one group. When the written data in the lower PPUs in one group of the first PEUs reaches a certain degree, the MMC 502 selects one group of the second PEUs from the spare area and further arranges unsorted data in the first PEUs into the lower PPUs in said group of the second PEUs. Here, an operation of arranging the data in the first PEUs into the second PEUs is also known as a data arrangement operation, and a number of the second PEUs stored with data is not greater than a predetermined number. Then, the MMC 502 programs the data in the lower PPUs in said group of the second PEUs into all the PPUs in one fifth PEU in order to finish storage of image data or video data. Here, an operation of programming the data in the second PEUs into the fifth PEU is also known as a data merging operation.

Figures 7A, 7B:
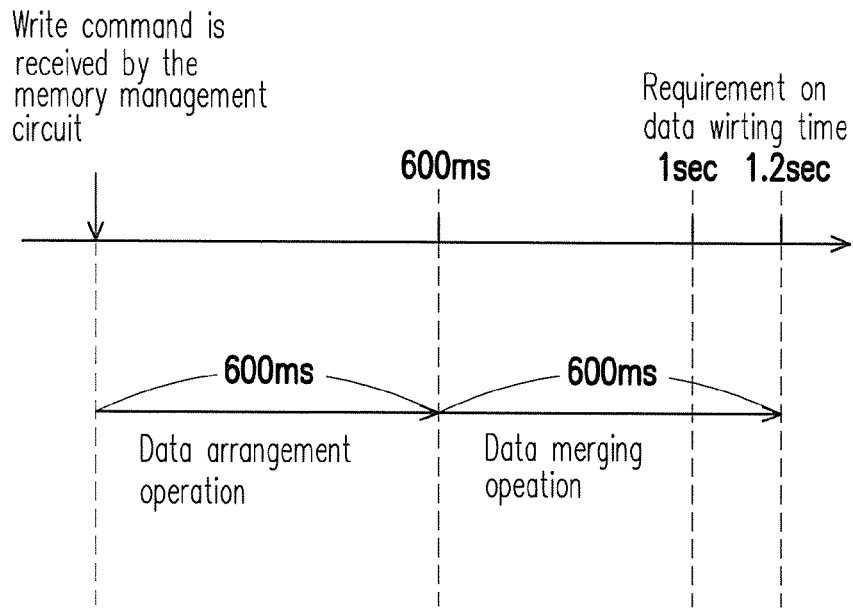
FIG. 7A and FIG. 7B illustrate data writing times required in the conventional data arrangement operation and the conventional data merging operation.

FIG. 7A and FIG. 7B illustrate data writing times required in the conventional data arrangement operation and the conventional data merging operation.

Referring to FIG. 7A, when the memory storage apparatus currently serves as various non-volatile memory storage apparatus like SD card, CF card or an embedded storage device used by systems including a digital camera, a camcorder, a communication device or a tablet computer, to prevent the data temporarily stored in the cache memory from being erased before written into the RNVM module due to the overly slow writing speed, a more strict requirement on a writing time for writing data (e.g., the writing time needs to be less than 1 sec (second)) is introduced. It is assumed that the data arrangement operation and the data merging operation each requires 600 millisecond (ms) to finish. In this case, after performing the data arrangement operation corresponding to one specific write command, if the memory storage apparatus successively performs the data merging operation corresponding to the specific write command, the traditional memory storage apparatus is apparently unable to achieve the requirement on the writing time (i.e., 1 sec) for writing data.

In addition, while recording videos or taking photos, the host system generates file information and metadata for recording videos or images. If the file information and the metadata are distributed across different PEUs among one group of the first PEUs after being written into said group of the first PEUs and the data in said group of the first PEUs written with the file information and the metadata are unchanged over long time, although said group of the first PEUs is not fully written (i.e., part of the PPUs in said group of the first PEUs is not written with data)—namely, said group of the first PEUs still has spaces for temporarily storing data—the MMC still regards said group of the first PEUs as already in use. Referring to FIG. 7B, if the MMC receives data to be written into one specific LU from the host system when multiple groups of the first PEUs are regarded as already in use, the number of the first PEUs is insufficient for temporarily storing said data. As a result, the host system needs to wait until the data arrangement operation corresponding to another command is performed by the MMC. In this case, the memory storage apparatus is apparently unable to achieve aforesaid requirement on the writing time (i.e., 1 sec) for writing data. In other words, if the time spent for performing the writing operation is overly long because the host system needs to wait until the data arrangement operation is performed by the MMC, the host system 11 may have the to-be-written data temporarily stored in the cache memory erased. As a result, the videos or the images to be stored may be incomplete due to the data loss.

With consideration of the above, in the present exemplary embodiment, the MMC 502 records a count value for each of the first PEUs 610(0) to 610(D), and updates those count values when writing data (also known as first data) corresponding to one write command (also known as a first write command) into at least one (i.e., one or more) PEU (also known as one or more third PEUs) in the first PEUs 610(0) to 610(D). Each of the count values represents the time when the respective one of the first PEUs is in the idle state. The MMC 502 can obtain a usage frequency of each of the first PEUs by identifying the count value counted for each of the first PEUs. In the present exemplary embodiment, when the MMC 502 determines the usage frequency of at least one (i.e., one or more) PEU (also known as one or more fourth PEUs) in the first PEUs as less than a predetermined value, the MMC 502 performs the data arrangement operation for the one or more fourth PEUs to program data (also known as second data) stored in the one or more fourth PEUs into one or more of the second PEUs. Particularly, during the data arrangement operation, it is possible that the one or more fourth PEUs is not fully written (i.e., part of the PPUs of the PEU is not written with data). Accordingly, since the MMC 502 can actively arrange the PEUs temporarily stored with the unchanged data over long time, the MMC 502 may be prevented from regarding the PEU not fully written as already in use. Also, a time delay and the data loss caused by insufficient number of the first PEUs for temporarily storing data may also be prevented. In order to describe the data writing method and the operations of the MMC 502 of the invention more clearly, an example is provided below with reference to FIG. 8A and FIG. 8B.

Figure 8A:
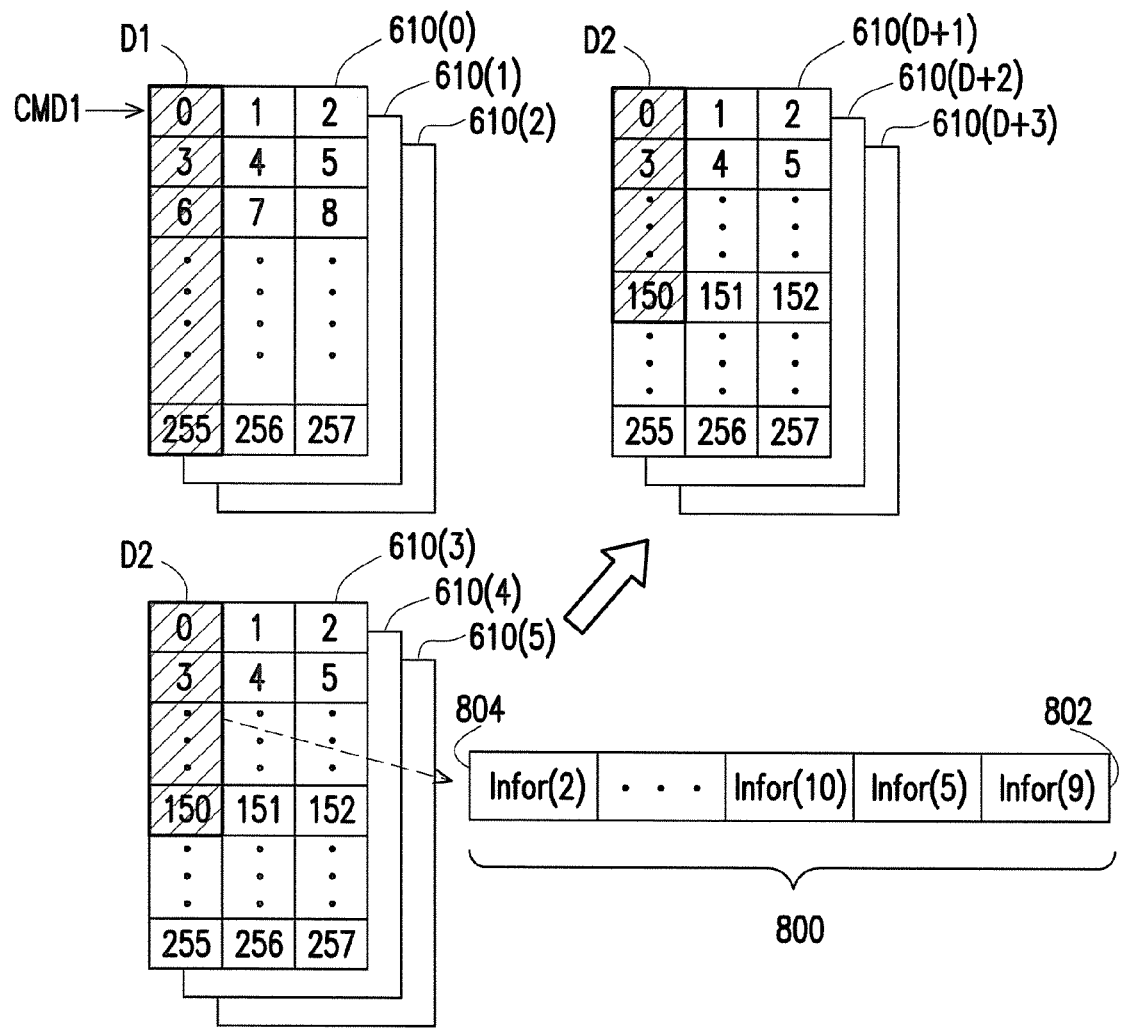
FIG. 8A is a schematic diagram illustrating the data arrangement operation corresponding to the first write command according to an exemplary embodiment of the invention.
Figure 8B:
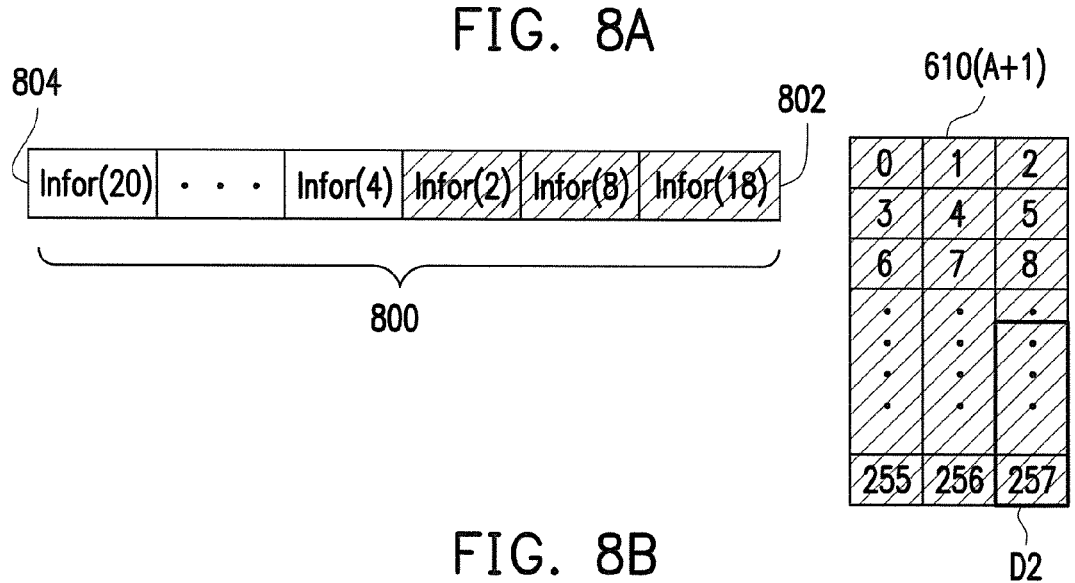
FIG. 8B is a schematic diagram illustrating the data merging operation corresponding to the first write command according to an exemplary embodiment of the invention.

FIG. 8A is a schematic diagram illustrating the data arrangement operation corresponding to the first write command according to an exemplary embodiment of the invention. FIG. 8B is a schematic diagram illustrating the data merging operation corresponding to the first write command according to an exemplary embodiment of the invention.

Referring to FIG. 8A, first of all, the MMC 502 receives a first write command CMD 1 and first data D1 corresponding to the first write command CMD 1 from the host system 11 and writes the first data D1 into the third PEU 610(0) in the first PEUs. Then, the MMC 502 counts the count values of the first PEUs other than the third PEU 610(0) by, for example, adding 1 to each of the count values of the first PEUs 610(1) to 610(D), and determines whether at least one PEU having the count value greater than a predetermined threshold (also known as a first predetermined threshold) exists in the first PEUs 610(1) to 610(D). Specifically, each time when the MMC 502 receives the write command from the host system 11, the count value of the first PEUs not written with the data corresponding to the write command is being accumulated 1. In other words, the count value represents the time when the first PEU is in the idle state. In this example, the count value of one first PEU becomes greater as the number of times the first PEU is not written with data increases. Here, it is assumed that the MMC 502 determines the count value of the fourth PEU 610(3) as greater than the first predetermined threshold (i.e., equivalent to the usage frequency of the fourth PEU 610(3) being less than the predetermined value). In this case, the MMC 502 performs the data arrangement operation to copy data (also known as second data D2) stored by the fourth PEU 610(3) to the second PEU 610(D+1). Then, the MMC 502 erases the second data D2 stored by the fourth PEU 610(3) to release one empty PEU, and sets the count value of the fourth PEU 610(3) to zero.

The invention is not intended to limit the method used for identifying the PEU having the usage frequency less than the predetermined value in the first PEUs 610(0) to 610(D). For example, in another exemplary embodiment, when writing the first data into the third PEU 610(0) in the first PEUs 610(0) to 610(D), the MMC 502 counts the count value of the third PEU 610(0) by, for example, adding 1 to the count value of the third PEU 610(0), and determines whether at least one PEU having the count value less than a predetermined threshold (also known as a second predetermined threshold) exists in the first PEUs 610(1) to 610(D) other than the third PEU 610(0). In this example, each time when the MMC 502 receives the write command from the host system 11, the count value of the first PEU written with data corresponding to the write command is constantly being accumulated. In other words, the count value of the first PEU becomes smaller as the number of times that the first PEU is not written with data increases. Here, it is assumed that the MMC 502 determines the count value of the fourth PEU 610(3) as less than the second predetermined threshold (i.e., equivalent to the usage frequency of the fourth PEU 610(3) being less than the predetermined value). In this case, the MMC 502 performs the data arrangement operation to copy the second data D2 stored by the fourth PEU 610(3) to the second PEU 610(D+1). Then, the MMC 502 erases the second data D2 stored by the fourth PEU 610(3) to release one empty PEU, and sets the count value of the fourth PEU 610(3) to zero.

It should be noted, in the foregoing exemplary embodiments, the description is provided with the example in which the fourth PEU is different from the third PEU for writing the first data corresponding to the first write command. However, in another exemplary embodiment, the third PEU for writing the first data corresponding to the first write command may also be the PEU having the unchanged data over long time. In other words, the fourth PEU identified as having the usage frequency less than the predetermined value may also be the third PEU. In such case, the MMC 502 also performs the data arrangement operation to copy the data originally stored in the third PEU and the first data corresponding to the first write command to at least one of the second PEUs.

In addition, the invention is not intended to limit the first predetermined threshold and the second predetermined threshold to the above. For example, the first predetermined threshold may be identical to or different from the second predetermined threshold. Also, the first predetermined threshold and the second predetermined threshold may be set according to the factory technical specification of the memory storage apparatus 10, or may also be set according to the executive performance of the memory storage apparatus 10. Further, in yet another exemplary embodiment, the MMC 502 records a writing time, a writing count or a written data volume within a predetermined period of time for each of the first PEUs 610(0) to 610(D), and performs the data arrangement operation for those having the writing time with longer interval, fewer writing count or less written data volume when writing the first data into the third PEU 610(0) in the first PEUs 610(0) to 610(D). The data arrangement operation has been provided in detail in the foregoing description for FIG. 8A, which is not repeated hereinafter.

The data arrangement operation for copying the second data D2 stored by the fourth PEU 610(3) to the second PEU 610(D+1) is performed by the MMC 502 after the first write command CMD 1 is received by the MMC 502, and is thus referred to as the data arrangement operation corresponding to the first write command CMD 1 in the present exemplary embodiment. In the present exemplary embodiment, a command information queue 800 is further assigned in the second PEUs 610(D+1) to 610(A). When the MMC 502 performs the data arrangement operation corresponding to the first write command CMD 1, the MMC 502 puts command information Infor(2) (also known as first command information) corresponding to the second data D2 into the command information queue 800. The command information in the command information queue 800 are executed in a pipeline manner.

Specifically, an execution sequence of the command information in the command information queue 800 complies with the FIFO (First In First Out) rule. For example, the command information queue 800 has a first end 802 and a second end 804. The command information in the command information queue 800 are executed in sequence starting from the first end 802. Later, the command information corresponding to one specific data to be putted by the MMC 502 when executing the data arrangement operation is putted in the command information queue 800 next to the previous command information. In other words, the command information currently putted by the MMC 502 is the command information of the second end 804. Because the data stored in the second PEUs 610(D+1) to 610(A) is the data being arranged and having the continuous logical addresses, the command information corresponding to said data is also arranged in the command information queue 800 according to the continuous logical addresses. Particularly, in the present exemplary embodiment, as long as the command information queue 800 is stored with the command information, the MMC 502 can constantly perform the data merging operation to copy data corresponding to the command information and having a size of one PEU in the second PEUs to one of the fifth PEUs 610(A+1) to 610(B) according to the command information.

Referring to FIG. 8A and FIG. 8B, while the MMC 502 is putting the first command information Infor(2) corresponding to the second data D2 into the command information queue 800, the MMC 502 still actually gives the write command sequence continuously to perform the data merging operation according to the other command information. As such, the first command information Infor(2) will be gradually moved closer to the first end 802 and eventually executed by the MMC 502. For example, the MMC 502 copies data including the second data D2 and having the size of one PEU from one group of the second PEUs to the fifth PEU 610(A+1) according to the command information Infor(18), the command information Infor(8) and the first command information Infor(2). Here, an operation of copying the data including the second data D2 and having the size of one PEU to the fifth PEU 610(A+1) is referred to as the data merging operation corresponding to the first write command CMD 1.

Particularly, according to the mechanism of the present exemplary embodiment in which the obtained command information of the command information queue are executed in the pipeline manner, when one specific write command is being executed, the MMC 502 first arranges the data corresponding the specific write command to the PEU used for temporarily storing data in the rewritable non-volatile memory module 406 (i.e., the data arrangement operation of a first stage). Then, the command information corresponding to the data are executed in the pipeline manner, and the data corresponding to the specific write command is then written into the PEUs actually used for storing data in the RNVM module 406 (i.e., the data merging operation of a second stage). Therefore, the first stage corresponding to one specific write command (i.e., the data arrangement operation) and the second stage (i.e., the data merging operation) corresponding to another write command may be performed simultaneously.

Figure 9A:
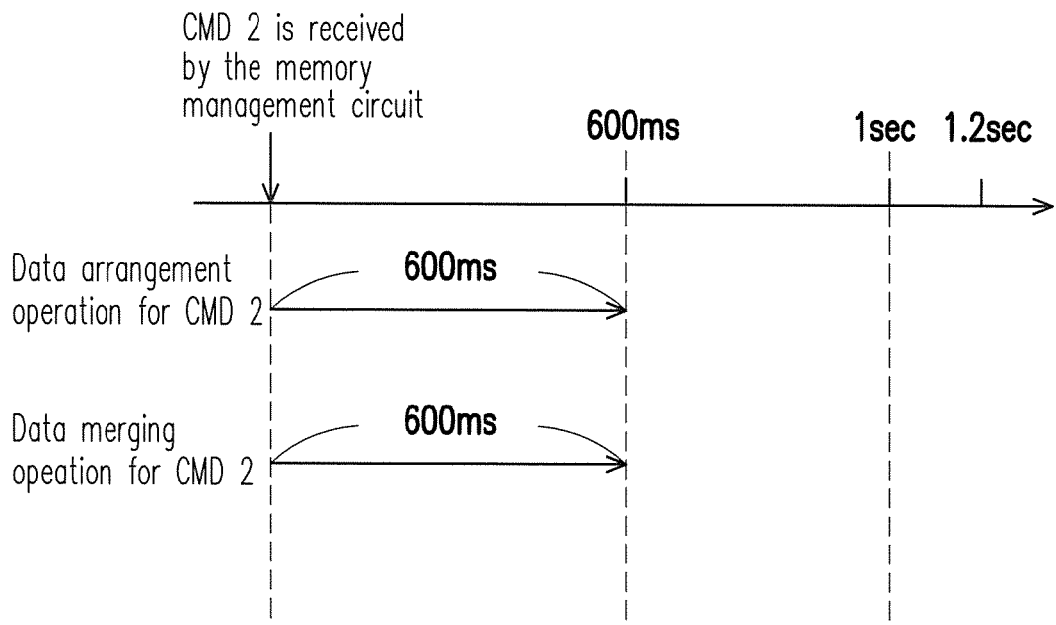
FIG. 9A and FIG. 9B illustrate data writing times required in the data arrangement operation and the data merging operation according to an exemplary embodiment of the invention.
Figure 9B:
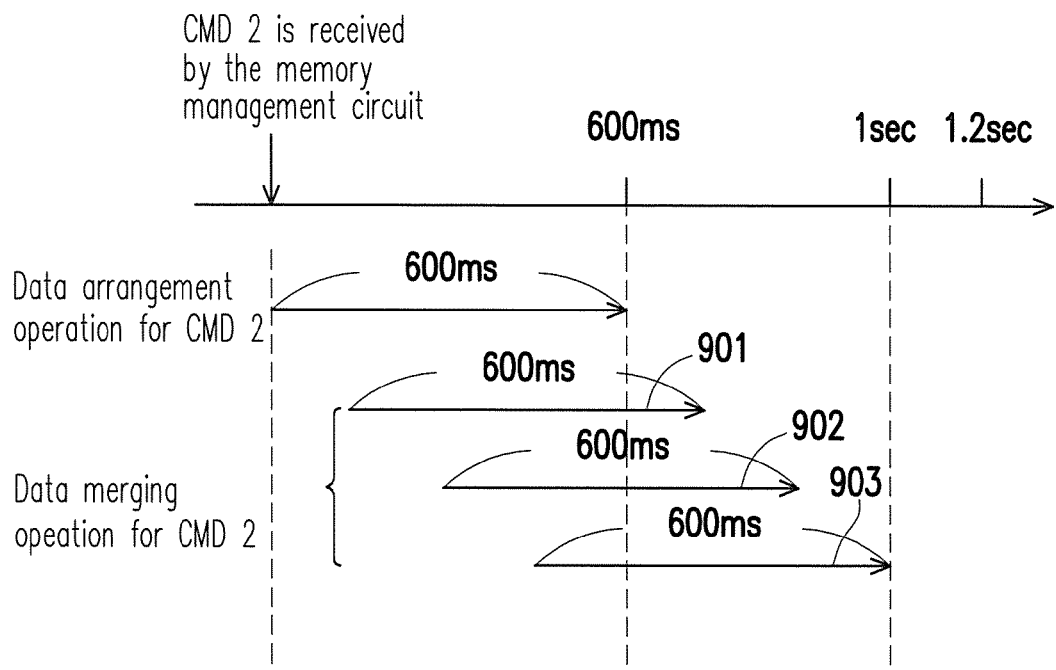

FIG. 9A and FIG. 9B illustrate data writing times required in the data arrangement operation and the data merging operation according to an exemplary embodiment of the invention.

More specifically, it is assumed that the MMC 502 receives another write command (also known as a second write command CMD 2) and data (also known as third data) corresponding to the second write command CMD 2 after receiving the first write command CMD 1. In this case, the MMC 502 also performs the data arrangement operation corresponding to the second write command CMD 2. Here, the data arrangement operation corresponding to the second write command CMD 2 is identical or similar to the data arrangement operation corresponding to the first write command CMD 1. The data arrangement operation has been provided in detail in the foregoing description for FIG. 8A, which is not repeated hereinafter. Particularly, the data merging operation corresponding to the first write command CMD 1 is performed independent from the data arrangement operation corresponding to the second write command CMD 2. For example, the data merging operation corresponding to the first write command CMD 1 is performed during the data arrangement operation corresponding to the second write command CMD 2. It should be noted that, the statement "the data merging operation corresponding to the first write command CMD 1 is performed during the data arrangement operation corresponding to the second write command CMD 2" may indicate that the data merging operation corresponding to the first write command CMD 1 and the data arrangement operation corresponding to the second write command CMD 2 are simultaneously performed (as shown in FIG. 9A), or a period (e.g., one of periods 901 to 903 of the data merging operation) in which the data merging operation corresponding to the first write command CMD 1 is performed overlaps with a period in which the data arrangement operation corresponding to the second write command CMD 2 is performed (as shown in FIG. 9B), which are not particularly limited by the invention. In this way, in the example where the data arrangement operation and the data merging operation each requires 600 ms to finish, according to the mechanism in which the obtained command information of the command information queue are executed in the pipeline manner, the writing time of each of the data arrangement operation and the data merging operation corresponding to one write command performed by the MMC 502 is equivalent to requiring 600 ms or within 1 sec time to finish. Therefore, not only can the requirement of the memory storage apparatus on the writing time for the data be satisfied, the data temporarily stored in the cache memory may also be prevented from being erased before written into the RNVM module due to the overly slow writing speed.

Figure 10:
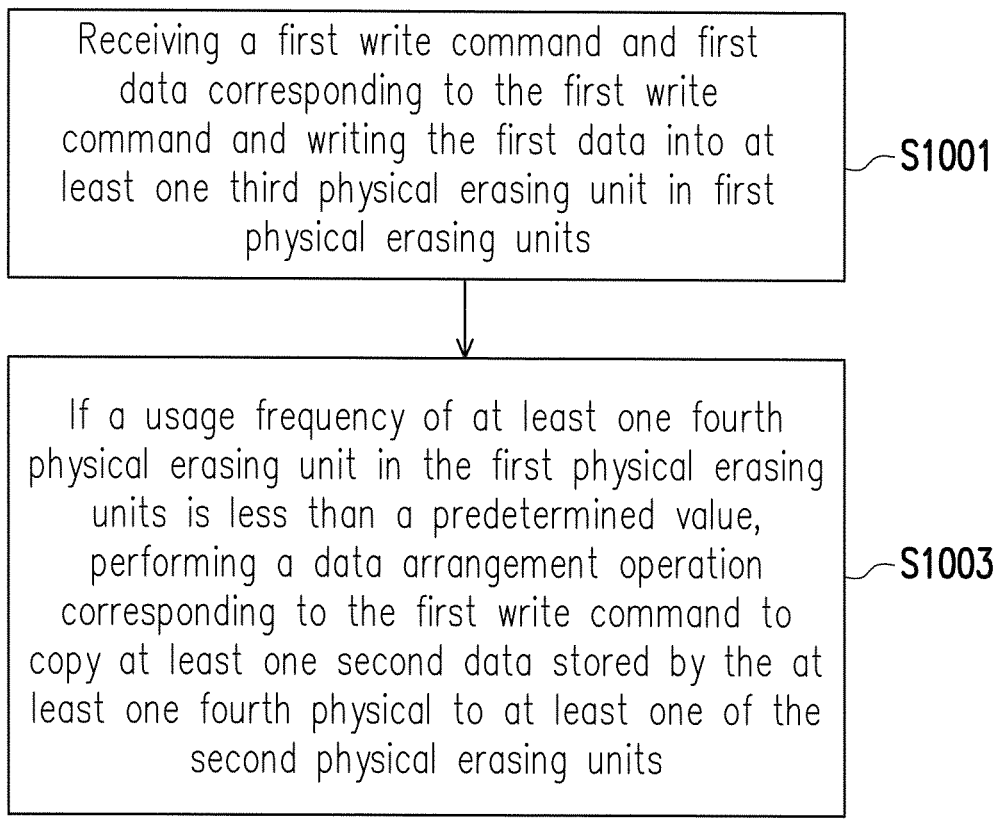
FIG. 10 is a flowchart of a data writing method according to an exemplary embodiment of the invention.

FIG. 10 is a flowchart of a data writing method according to an exemplary embodiment of the invention.

Referring to FIG. 10, in step S1001, the MMC 502 receives a first write command and first data corresponding to the first write command and writes the first data into one or more third PEUs in first PEUs.

In step S1003, if a usage frequency of one or more fourth PEUs in the first PEUs is less than a predetermined value, the MMC 502 performs a data arrangement operation corresponding to the first write command to copy second data stored by the one or more fourth PEUs to at least one of the second PEUs.

Nevertheless, steps depicted in FIG. 10 are described in detail as above so that related description thereof is omitted hereinafter. It should be noted that, the steps depicted in FIG. 10 may be implemented as a plurality of program codes or circuits, which are not particularly limited in the invention. Moreover, the method disclosed in FIG. 10 may be implemented by reference with above exemplary embodiments, or may be implemented separately, which are not particularly limited in the invention.

In summary, according to the data writing method, the memory storage apparatus and the MCCU proposed in the exemplary embodiments of the invention, by identifying the count value counted for each of the PEUs, the time in which each PEU temporarily stored with data is in the idle state may be obtained to actively arrange the PEUs temporarily stored with the unchanged data over long time. Accordingly, the time delay and the data loss caused by insufficient number of PEUs for temporarily storing data may be prevented. On the other hand, according to the mechanism of the present exemplary embodiment in which the obtained command information of the command information queue are executed in the pipeline manner, because the data arrangement operation corresponding to one write command and the data merging operation corresponding to another write command may be simultaneously performed, the writing time for writing the data corresponding to one write command may be substantially reduced.

In view of the above, with the active arrangement for the PEUs temporarily stored with the data over long time and the mechanism of executing the command information in the pipeline manner as described in the invention, not only can the requirement of the memory storage apparatus on the writing time for the data be effectively satisfied, the data temporarily stored in the cache memory may also be prevented from being erased before written into the RNVM module due to the overly slow writing speed. As a result, speed and performance of the memory storage apparatus may be effectively improved when performing the data writing operation to further ensure the reliability of the stored data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method, adapted for a rewritable non-volatile memory module, wherein the rewritable non-volatile memory module comprises a plurality of physical erasing units, the physical erasing units at least comprise a plurality of first physical erasing units and a plurality of second physical erasing units, and the data writing method comprises:

receiving a first write command and first data corresponding to the first write command and writing the first data into a third physical erasing unit in the first physical erasing units; and if a usage frequency of a fourth physical erasing unit in the first physical erasing units is less than a predetermined value, performing a data arrangement operation corresponding to the first write command to copy second data stored by the fourth physical to at least one of the second physical erasing units, wherein the less usage frequency of the fourth physical erasing unit indicates that number of times of writing data into the fourth physical erasing unit is less.

2. The data writing method according to claim 1, wherein the fourth physical erasing unit in the first physical erasing units is not fully written when the data arrangement operation corresponding to the first write command is performed.

3. The data writing method according to claim 1, further comprising: recording a count value for each of the first physical erasing units, wherein steps after writing the first data into the third physical erasing unit in the first physical erasing units comprise:
    counting the count values of the first physical erasing units other than the third physical erasing unit;
    determining the usage frequency of the fourth physical erasing unit as less than the predetermined value if the count value of the fourth physical erasing unit is greater than a first predetermined threshold; and
    erasing the second data stored by the fourth physical erasing unit and setting the count value corresponding to the fourth physical erasing unit to zero after copying the second data to the at least one of the second physical erasing units.

4. The data writing method according to claim 1, further comprising: recording a count value for each of the first physical erasing units, wherein steps after writing the first data into the third physical erasing unit in the first physical erasing units comprise:
    counting the count value of the third physical erasing unit;
    determining the usage frequency of the fourth physical erasing unit as less than the predetermined value if the count value of the fourth physical erasing unit is less than a second predetermined threshold; and
    erasing the second data stored by the fourth physical erasing unit and setting the count value corresponding to the fourth physical erasing unit to zero after copying the second data to the at least one of the second physical erasing units.

5. The data writing method according to claim 1, wherein the first physical erasing units are configured to store data having discontinuous logical addresses, and the second physical erasing units are configured to store data having continuous logical addresses, wherein the step of copying the second data stored by the fourth physical erasing unit to the at least one of second physical erasing units comprises:
    selecting the at least one of the second physical erasing units from a spare area for writing the second data, wherein a number of the second physical erasing units stored with data is not greater than a predetermined number.

6. The data writing method according to claim 1, wherein a command information sequence is assigned in the second physical erasing units, wherein the step of copying the second data stored by the fourth physical erasing unit to the at least one of second physical erasing units comprises:
    putting first command information corresponding to the second data into the command information queue, wherein command information in the command information queue are executed in a pipeline manner.

7. The data writing method according to claim 6, wherein the physical erasing units further comprise a plurality of fifth physical erasing units, and the data writing method further comprises:
    performing a data merging operation corresponding to the first write command to copy the second data in the second physical erasing units to at least one of the fifth physical erasing units according to the first command information.

8. The data writing method according to claim 7, further comprising:
    receiving a second write command and third data corresponding to the second write command and performing the data arrangement operation corresponding to the second write command, wherein the data merging operation corresponding to the first write command is performed independent from the data arrangement operation corresponding to the second write command.

9. The data writing method according to claim 8, wherein one memory cell in the first physical erasing units and the second physical erasing units is programmed based on a first programming mode in which bits data of a first number is stored into said memory cell,
    wherein one memory cell in the fifth physical erasing units is programmed based on a second programming mode in which bits data of a second number is stored into said memory cell,
    wherein the first number is less than the second number.

10. A memory control circuit unit for controlling a rewritable non-volatile memory module, wherein the rewritable non-volatile memory module comprises a plurality of physical erasing units, each of the physical erasing units comprises a plurality of physical programming units, and the physical erasing units at least comprise a plurality of first physical erasing units and a plurality of second physical erasing units, wherein the memory control circuit unit comprises:
    a host interface, configured to couple to a host system;
    a memory interface, configured to couple to the rewritable non-volatile memory module; and
    a memory management circuit, coupled to the host interface and the memory interface, and configured to receive a first write command and first data corresponding to the first write command and write the first data into a third physical erasing unit in the first physical erasing units,
    wherein if a usage frequency of a fourth physical erasing unit in the first physical erasing units is less than a predetermined value, the memory management circuit performs a data arrangement operation corresponding to the first write command to copy second data stored by the fourth physical to at least one of the second physical erasing units, wherein the less usage frequency of the fourth physical erasing unit indicates that number of times of writing data into the fourth physical erasing unit is less.

11. The memory control circuit unit according to claim 10, wherein the fourth physical erasing unit in the first physical erasing units is not fully written when the data arrangement operation corresponding to the first write command is performed.

12. The memory control circuit unit according to claim 10, wherein the memory management circuit is further configured to record a count value for each of the first physical erasing units, and after the operation of writing the first data into the third physical erasing unit in the first physical erasing units, the memory management circuit is further configured to count the count values of the first physical erasing units other than the third physical erasing unit,
    wherein the memory management circuit determines the usage frequency of the fourth physical erasing unit as less than the predetermined value if the count value of the fourth physical erasing unit is greater than a first predetermined threshold, wherein the memory management circuit is further configured to erase the second data stored by the fourth physical erasing unit and set the count value corresponding to the fourth physical erasing unit to zero after copying the second data to the at least one of the second physical erasing units.

13. The memory control circuit unit according to claim 10, wherein the memory management circuit is further configured to record a count value for each of the first physical erasing units, and after the operation of writing the first data into the third physical erasing unit in the first physical erasing units, the memory management circuit is further configured to count the count value of the third physical erasing unit, wherein the memory management circuit determines the usage frequency of the fourth physical erasing unit as less than the predetermined value if the count value of the fourth physical erasing unit is less than a second predetermined threshold, wherein the memory management circuit is further configured to erase the second data stored by the fourth physical erasing unit and set the count value corresponding to the fourth physical erasing unit to zero after copying the second data to the at least one of the second physical erasing units.

14. The memory control circuit unit according to claim 10, wherein the first physical erasing units are configured to store data having discontinuous logical addresses, and the second physical erasing units are configured to store data having continuous logical addresses, wherein in the operation of copying the second data stored by the fourth physical erasing unit to the at least one of second physical erasing units, the memory management circuit is further configured to select the at least one of the second physical erasing units from a spare area for writing the second data, wherein a number of the second physical erasing units stored with data is not greater than a predetermined number.

15. The memory control circuit unit according to claim 10, wherein a command information queue is assigned in the second physical erasing units, and in the operation of copying the second data stored by the fourth physical erasing unit to the at least one of second physical erasing units, the memory management circuit is further configured to put first command information corresponding to the second data into the command information queue, wherein command information in the command information queue are executed in a pipeline manner.

16. The memory control circuit unit according to claim 15, wherein the physical erasing units further comprise a plurality of fifth physical erasing units, and the memory management circuit is further configured to perform a data merging operation corresponding to the first write command to copy the second data in the second physical erasing units to at least one of the fifth physical erasing units according to the first command information.

17. The memory control circuit unit according to claim 16, wherein the memory management circuit is further configured to receive a second write command and third data corresponding to the second write command and perform the data arrangement operation corresponding to the second write command, wherein the data merging operation corresponding to the first write command is performed independent from the data arrangement operation corresponding to the second write command.

18. The memory control circuit unit according to claim 17, wherein one memory cell in the first physical erasing units and the second physical erasing units is programmed based on a first programming mode in which bits data of a first number is stored into said memory cell, wherein one memory cell in the fifth physical erasing units is programmed based on a second programming mode in which bits data of a second number is stored into said memory cell, wherein the first number is less than the second number.

19. A memory storage apparatus, comprising:
a connection interface unit, configured to couple to a host system;
a rewritable non-volatile memory module; and
a memory control circuit unit, coupled to the connection interface unit and the rewritable non-volatile memory module, wherein the rewritable non-volatile memory module comprises a plurality of physical erasing units, each of the physical erasing units comprises a plurality of physical programming units, and the physical erasing units at least comprise a plurality of first physical erasing units and a plurality of second physical erasing units, wherein the memory control circuit unit is further configured to receive a first write command and first data corresponding to the first write command and write the first data into a third physical erasing unit in the first physical erasing units, wherein if a usage frequency of a fourth physical erasing unit in the first physical erasing units is less than a predetermined value, the memory control circuit unit performs a data arrangement operation corresponding to the first write command to copy second data stored by the fourth physical to at least one of the second physical erasing units, wherein the less usage frequency of the fourth physical erasing unit indicates that number of times of writing data into the fourth physical erasing unit is less.

20. The memory storage apparatus according to claim 19, wherein the fourth physical erasing unit in the first physical erasing units is not fully written when the data arrangement operation corresponding to the first write command is performed.

21. The memory storage apparatus according to claim 19, wherein the memory control circuit unit is further configured to record a count value for each of the first physical erasing units, and after the operation of writing the first data into the third physical erasing unit in the first physical erasing units, the memory control circuit unit is further configured to count the count values of the first physical erasing units other than the third physical erasing unit, wherein the memory control circuit unit determines the usage frequency of the fourth physical erasing unit as less than the predetermined value if the count value of the fourth physical erasing unit is greater than a first predetermined threshold, wherein the memory control circuit unit is further configured to erase the second data stored by the fourth physical erasing unit and set the count value corresponding to the fourth physical erasing unit to zero after copying the second data to the at least one of the second physical erasing units.

22. The memory storage apparatus according to claim 19, wherein the memory control circuit unit is further configured to record a count value for each of the first physical erasing units, and after the operation of writing the first data into the third physical erasing unit in the first physical erasing units, the memory control circuit unit is further configured to count the count value of the third physical erasing unit, wherein the memory control circuit unit determines the usage frequency of the fourth physical erasing unit as less than the predetermined value if the count value of the fourth physical erasing unit is less than a second predetermined threshold, wherein the memory control circuit unit is further configured to erase the second data stored by the fourth physical erasing unit and set the count value corresponding to the fourth physical erasing unit to zero after copying the second data to the at least one of the second physical erasing units.

23. The memory storage apparatus according to claim 19, wherein the first physical erasing units are configured to store data having discontinuous logical addresses, and the second physical erasing units are configured to store data having continuous logical addresses, wherein in the operation of copying the second data stored by the fourth physical erasing unit to the at least one of second physical erasing units, the memory control circuit unit is further configured to select the at least one of the second physical erasing units from a spare area for writing the second data, wherein a number of the second physical erasing units stored with data is not greater than a predetermined number.

24. The memory storage apparatus according to claim 19, wherein a command information queue is assigned in the second physical erasing units, and in the operation of copying the second data stored by the fourth physical erasing unit to the at least one of second physical erasing units, the memory control circuit unit is further configured to put first command information corresponding to the second data into the command information queue, wherein command information in the command information queue are executed in a pipeline manner.

25. The memory storage apparatus according to claim 24, wherein the physical erasing units further comprise a plurality of fifth physical erasing units, and the memory control circuit unit is further configured to perform a data merging operation corresponding to the first write command to copy the second data in the second physical erasing units to at least one of the fifth physical erasing units according to the first command information.

26. The memory storage apparatus according to claim 25, wherein the memory control circuit unit is further configured to receive a second write command and third data corresponding to the second write command and perform the data arrangement operation corresponding to the second write command, wherein the data merging operation corresponding to the first write command is performed independent from the data arrangement operation corresponding to the second write command.

27. The memory storage apparatus according to claim 26, wherein one memory cell in the first physical erasing units and the second physical erasing units is programmed based on a first programming mode in which bits data of a first number is stored into said memory cell, wherein one memory cell in the fifth physical erasing units is programmed based on a second programming mode in which bits data of a second number is stored into said memory cell, wherein the first number is less than the second number.

\* \* \* \* \*